(12) United States Patent
Zimmer et al.

(10) Patent No.: US 12,092,704 B2
(45) Date of Patent: *Sep. 17, 2024

(54) XMR SENSORS WITH SERIAL SEGMENT STRIP CONFIGURATIONS

(71) Applicant: Infineon Technologies AG, Neubiberg (DE)

(72) Inventors: Juergen Zimmer, Neubiberg (DE); Wolfgang Raberg, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/963,288

(22) Filed: Oct. 11, 2022

(65) Prior Publication Data

US 2023/0034717 A1    Feb. 2, 2023

Related U.S. Application Data (63) Continuation of application No. 12/908,469, filed on Oct. 20, 2010, now Pat. No. 11,506,732.

(51) Int. Cl.
*G01R 33/09* (2006.01)

(52) U.S. Cl.
CPC ......... *G01R 33/091* (2013.01); *G01R 33/093* (2013.01); *G01R 33/098* (2013.01)

(58) Field of Classification Search
CPC ........ H10N 50/10; H10N 50/80; G01R 33/09; G01R 33/091; G01R 33/093;

(Continued)

(56) References Cited

U.S. PATENT DOCUMENTS

| 3,691,502 A | 9/1972 | Kataoka |
| 3,792,451 A * | 2/1974 | Almasi ............. G11C 19/0858 365/38 |

(Continued)

FOREIGN PATENT DOCUMENTS

| CN | 1165302 A | 11/1997 |
| CN | 1412940 A | 4/2003 |

(Continued)

OTHER PUBLICATIONS

English translation of the description of DE 19839450A1, obtained from https://worldwide.espacenet.com/advancedSearch?locale=en_ep, obtained on Oct. 28, 2023.*

(Continued)

*Primary Examiner* — David M Schindler
(74) *Attorney, Agent, or Firm* — Eschweiler & Potashnik, LLC (57) ABSTRACT

Some embodiments relate to a magnetoresistive sensor element comprising a magnetoresistive strip. The magnetoresistive strip includes a first linear segment, and a second linear segment arranged in series with the first linear segment. The second linear segment adjoins the first linear segment at a first inner corner corresponding to a first obtuse angle having a first magnitude. The magnetoresistive strip also includes a third linear segment arranged in series with the first and second linear segments, and a fourth linear segment arranged in series with the first, second, and third linear segments. The fourth linear segment adjoins the third linear segment at a second inner corner corresponding to a second obtuse angle having a second magnitude. Te second magnitude differs from the first magnitude.

10 Claims, 10 Drawing Sheets

(58) Field of Classification Search
CPC .. G01R 33/095; G01R 33/096; G01R 33/098; G01D 5/16; G01D 5/165
See application file for complete search history.

(56) References Cited

U.S. PATENT DOCUMENTS

| | | | |
|---|---|---|---|
| 3,820,092 A * | 6/1974 | Bobeck | G11C 19/0866 365/14 |
| 4,035,785 A * | 7/1977 | Kryder | G11C 19/0875 365/34 |
| 5,134,534 A | 7/1992 | Sasaki | |
| 5,627,466 A | 5/1997 | Spies et al. | |
| 5,670,876 A | 9/1997 | Dilger | |
| 6,222,361 B1 | 4/2001 | Shimano | |
| 6,366,079 B1 | 4/2002 | Uenoyama | |
| 6,727,694 B2 | 4/2004 | Doescher | |
| 6,822,443 B1 | 11/2004 | Dogaru | |
| 6,831,456 B2 | 12/2004 | Doescher | |
| 6,933,717 B1 | 8/2005 | Dogaru et al. | |
| 7,394,086 B2 | 7/2008 | Wakui et al. | |
| 7,598,736 B2 | 10/2009 | Zimmer et al. | |
| 11,506,732 B2 * | 11/2022 | Zimmer | G01R 33/091 |
| 2003/0011463 A1 | 1/2003 | Iwasaki | |
| 2006/0152218 A1 | 7/2006 | Schmollngruber et al. | |
| 2006/0202691 A1 | 9/2006 | Komatsu | |
| 2007/0080683 A1 | 4/2007 | Bartos et al. | |
| 2007/0290678 A1 | 12/2007 | Herrmann | |
| 2008/0024120 A1 | 1/2008 | Sasaki | |
| 2008/0054888 A1 | 3/2008 | Ando | |
| 2008/0179987 A1 | 7/2008 | Imazu | |
| 2008/0191694 A1 | 8/2008 | Bartos | |
| 2009/0058402 A1 | 3/2009 | Zimmer et al. | |
| 2009/0189601 A1 | 7/2009 | Okada | |
| 2009/0219754 A1 | 9/2009 | Fukumoto | |
| 2010/0072992 A1 | 3/2010 | Bauer | |

FOREIGN PATENT DOCUMENTS

| | | |
|---|---|---|
| CN | 1492383 A | 4/2004 |
| CN | 1584504 A | 2/2005 |
| CN | 1754080 A | 3/2006 |
| DE | 19839450 A1 | 3/2000 |
| JP | H11113276 A | 4/1994 |

OTHER PUBLICATIONS

Huaiwu, Zhang et al.; Studies of Low Field GMR Discontinuous Multi-Layers of [NiFe/Ag]; Vacuum Science and Technology (China); Mar. 2001.
Rhode, Kawal et al.; "A System of Real-Time XMR Guided Cardiovascular Intervention"; IEEE Transactions on Medical Imaging, vol. 24, No. 11; Nov. 2005.
Chinese Application No. 201110320318.4, Chinese Office Action, mailed Sep. 18, 2013, 6 pages.
Chinese Application No. 201110320318.4, Chinese Office Action, mailed Mar. 27, 2014, 7 pages.
Final Office Action Dated Feb. 17, 2015, U.S. Appl. No. 12/908,469.
Non-Final Office Action Dated Aug. 13, 2014, U.S. Appl. No. 12/908,469.
Final Office Action Dated May 8, 2014, U.S. Appl. No. 12/908,469.
Non-Final Office Action Dated Oct. 7, 2013, U.S. Appl. No. 12/908,469.
Non Final Office Action Dated Jul. 18, 2016 U.S. Appl. No. 12/908,469.
Non Final Office Action Dated Jun. 27, 2019, U.S. Appl. No. 12/908,469.
Final Office Action Dated Jan. 9, 2020, U.S. Appl. No. 12/908,469.
Non Final Office Action Dated Dec. 16, 2020, U.S. Appl. No. 12/908,469.
Final Office Action Dated Jul. 2, 2021, U.S. Appl. No. 12/908,469.
Non Final Office Action Dated Mar. 25, 2022, U.S. Appl. No. 12/908,469.
Notice of Allowance Dated Jul. 29, 2022, U.S. Appl. No. 12/908,469.
Non Final Office Action Dated Jun. 29, 2016, U.S. Appl. No. 15/160,244.
Final Office Action Dated Jan. 10, 2017 U.S. Appl. No. 15/160,244.
Non Final Office Action Dated Oct. 31, 2017, U.S. Appl. No. 15/160,244.
Final Office Action Dated Jun. 26, 2018, U.S. Appl. No. 15/160,244.
Non Final Office Action Dated Mar. 20, 2019, U.S. Appl. No. 15/160,244.
Final Office Action Dated Sep. 9, 2019, U.S. Appl. No. 15/160,244.
Notice of Allowance Dated Jan. 6, 2022, U.S. Appl. No. 15/160,244.
Definition of term distinct, Merriam-Webster, obtained from https://www.merriam-webster.com/dictionary/distinct, obtained on Jun. 21, 2018.

* cited by examiner

XMR SENSORS WITH SERIAL SEGMENT STRIP CONFIGURATIONS

REFERENCE TO RELATED APPLICATION

This application is a continuation of U.S. application Ser. No. 12/908,469, filed on Oct. 20, 2010, the contents of which are hereby incorporated by reference in their entirety.

TECHNICAL FIELD

The invention relates generally to integrated circuit (IC) sensors and more particularly to magnetoresistive IC sensors for rotational speed sensing applications.

BACKGROUND

Magnetoresistive sensors can include giant magnetoresistive (GMR), tunnel magnetoresistive (TMR), anisotropic magnetoresistive (AMR) and other technologies, referred to collectively as xMR technologies. XMR technologies can be used in rotational speed sensors, which conventionally include a pole wheel transducer wheel or ferrous wheel in combination with a magnetic back bias field perpendicular to the sensor plane. The xMR structures positioned near the wheel in these sensors are typically narrow strips with a homogenous width of, for example, less than 2 micrometers (µm) in order to provide a defined sensitivity by the shape anisotropy and a length of about, for example, 300 µm.

Transducer pole wheels have only a limited thickness, or axial width, such that the magnetic signal field is not homogenous over the entire xMR strip length. As axial distance increases from the pole wheel center, the By component increases and is phase-shifted by 180 degrees between the lower and upper half of the pole wheel. In combination with a Bx component which is phase-shifted by +/−90 degrees to the individual By components, the result is a rotation of the magnetic field vector in opposite senses of rotation for the lower and upper halves of the pole wheel and, as a consequence, for the lower and upper half of the xMR strip in a centered adjustment regarding the pole wheel. Depending on the pole wheel width and ratio/magnitude of the Bx/By components as a function of axial position, the counterrotating magnetic fields can also induce a counterrotating magnetization of the sensor layer, thereby generating temporary domain walls. The generation and annihilation of the domain walls results in a discontinuity, or jitter, in the output signal which can disturb the interpretation of the signal.

The shape anisotropy of the xMR strip can also result in a different behavior of the magnetization over the strip width. Whereas the domains in the center can follow an external magnetic field quite easily, the magnetization regions at the edges are much more stable. Domain walls between the strip center and edge can occur, and magnetization directions in the edge regions can suddenly turn along the external field when the field angle or field strength exceeds a certain value. This switching process is reflected in a discontinuity in the resistance characteristic. The field angle where the switching occurs, for a given sensor material (e.g., free layer thickness material, etc.), depends on the field conditions (By/Bx ratio) of the rotating field vector and the shape anisotropy and, therefore, the stripe width. The discontinuity in the output signal can affect the interpretation of the signal via jitter, pulse loss, etc.

Conventional approaches to addressing these problems include mounting a back bias magnet on a rear side of an xMR sensor to create a bias magnetic field to stabilize the direction of the free layer magnetization which can prevent free layer rotation but requires significant effort and can lead to a reduction in sensor sensitivity. Therefore, new solutions to minimize discontinuities in the output signal of xMR speed sensors are desired.

SUMMARY

In an embodiment, a magnetoresistive sensor element comprises a magnetoresistive strip comprising a plurality of serial segments, adjacent ones of the segments having different tilt angles.

In another embodiment, a magnetoresistive sensor element comprises a magnetoresistive strip comprising at least two segments serially coupled, a first segment having a negative curve and a second segment having a positive curve.

In another embodiment, a magnetoresistive sensor element comprises a magnetoresistive strip comprising a plurality of serially coupled segments, adjacent ones of the plurality of serially coupled segments having different widths.

In another embodiment, a method comprises forming a magnetoresistive strip having a first end and a second end; and adjusting a width of the first and second ends relative to a width of a center of the magnetoresistive strip to compensate for an unwanted magnetic field component.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to xMR sensors, including giant magnetoresistive (GMR), tunneling magnetoresistive (TMR) or anisotropic magnetoresistive (AMR), and the configuration of xMR strips within xMR sensors. GMR and TMR structure can be of the so-called spin-valve type in embodiments. Basically, a spin-valve comprises two functional magnetic layers: a first ferromagnetic layer (e.g., CoFe, NiFe, etc.) is magnetically pinned to a natural antiferromagnet (eg., PtMn, IrMn, etc.), forming a fixed reference magnetization, and a neighboring second ferromagnetic layer is magnetically decoupled by a non-magnetic interlayer (e.g., Cu, etc.) and forms a so-called free layer which can ideally follow the direction of an external in-plane magnetic field. Often, the single pinned layer is replaced by an artificial antiferromagnet having a pinned layer coupled to a natural antiferromagnet and a so-called reference layer which is antiferromagnetically coupled to the pinned layer by the RKKY exchange. This construction is more stable with respect to high magnetic field strengths.

In an embodiment, an xMR strip comprises a plurality of differently sized and/or differently oriented serially connected portions. In another embodiment, an xMR strip comprises a varying width or other characteristic. Such configurations can address discontinuities associated with conventional xMR sensors and improve xMR sensor performance.

In an xMR sensor, the magnetic field angle where edge magnetization switching occurs can depend on an angle between the structure orientation (shape anisotropy axis) and the external magnetic field. For GMR and TMR structures, the orientation of the reference magnetization determines at which signal level the discontinuity occurs. In an embodiment, a plurality of serially connected elements with different orientations (i.e., tilt angles) with respect to the reference magnetization form an xMR strip. In a rotating field, a discontinuity will occur at different field angles for the varying strip element orientations, and the more pronounced discontinuities of conventional sensors are reduced by averaging over a number of phase-shifted discontinuities.

Figure 1:
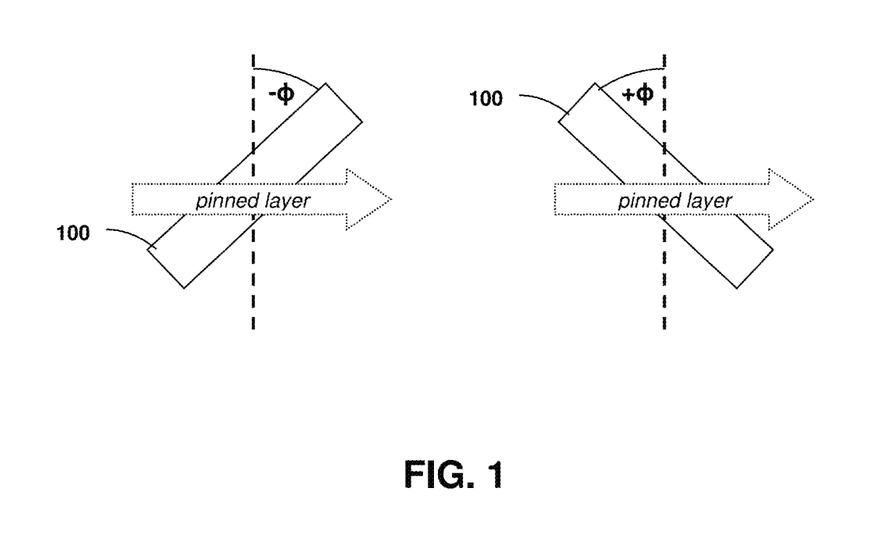
FIG. 1 depicts xMR strip tilt angles according to an embodiment.

FIG. 1 depicts positive and negative tilt angles of an xMR strip 100. XMR strip 100 is depicted with both negative and positive tilt angles, ($\phi$), with respect to an external field angle. The orientation of the pinned layer magnetization is constant.

Figure 2:
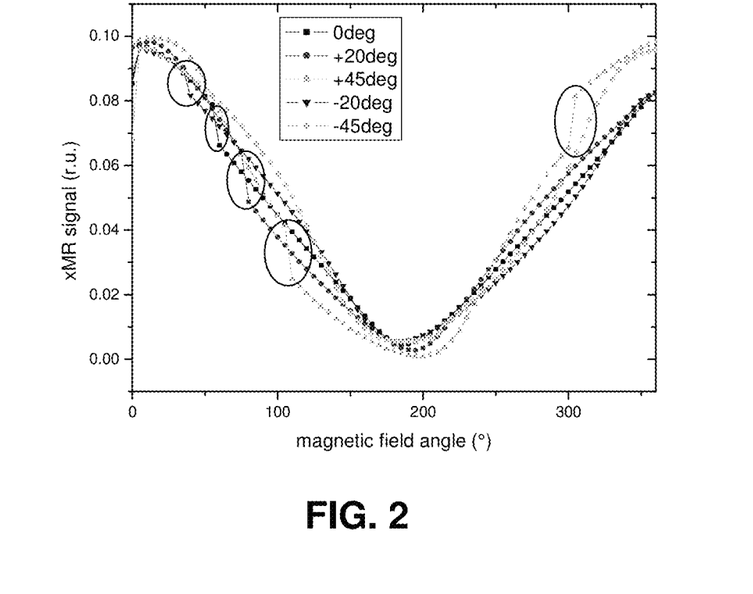
FIG. 2 depicts simulation results for various tilt angles according to an embodiment.

FIG. 2 is a graph of simulated output signals for five different tilt angles, ($\phi$): 0 degrees, +/−20 degrees and +/−45 degrees. Discontinuities for each angle are circled for convenience of illustration. As can be seen, discontinuities for the various tilt angles occur at different magnetic field angles. For example, a discontinuity for a tilt angle of −20 degrees occurs at a magnetic field angle of about 35 degrees, while a discontinuity for a tilt angle of +20 degrees occurs at a magnetic field angle of about 75 degrees.

Figure 3:
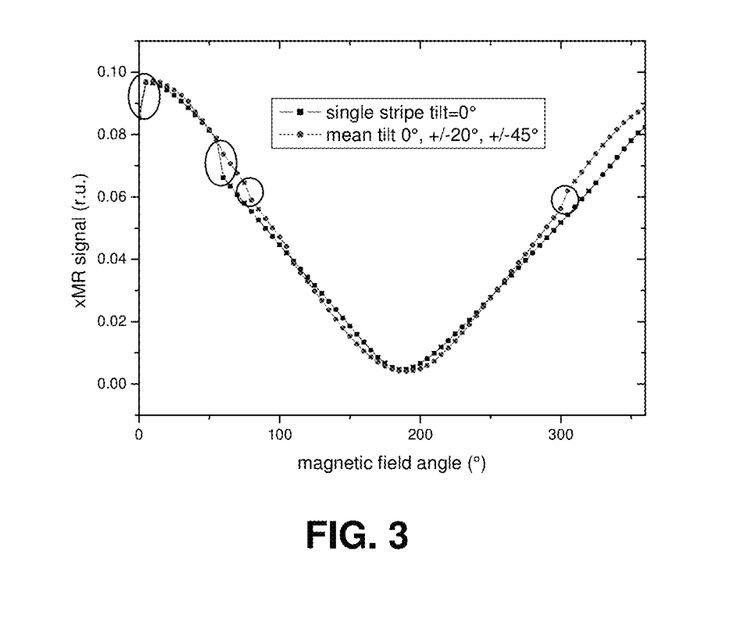
FIG. 3 depicts simulation results for a mean tilt angle according to an embodiment.

If the signals depicted in FIG. 2 are averaged according to an embodiment, however, a significantly smoother characteristic can be obtained. This is shown in FIG. 3, which also includes the simulation for 0 degrees as depicted in FIG. 2 for comparison. As can be seen in FIG. 3, large discontinuities are no longer present in the mean signal, rather only minor ripples which are circled. In embodiments, these ripples can be removed through a further discretization of the mean signal. A discontinuity in the signal at 0 degrees can still be seen in FIG. 3.

Expanding on the results of FIG. 3, embodiments therefore form xMR strips of a plurality of serially connected xMR portions, segments or elements having varying tilt angles and configurations with respect to the reference magnetization axis. These varying tilt angles can provide a "mean" output signal with reduced or eliminated discontinuities in embodiments.

Figure 4:
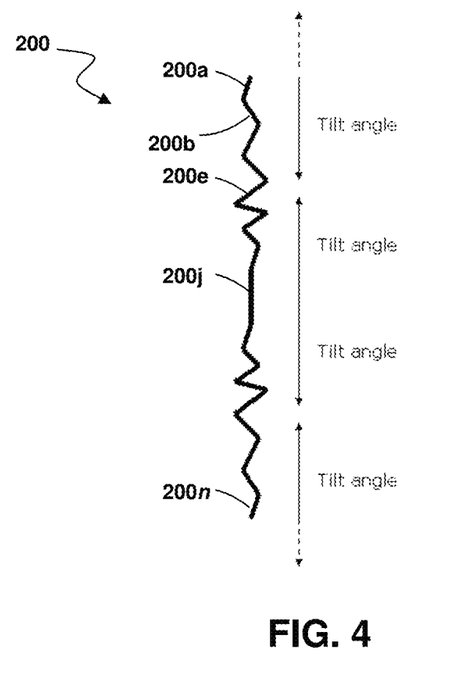
FIG. 4 depicts an xMR strip according to an embodiment.

An embodiment of an xMR strip 200 is depicted in FIG. 4. XMR strip 200 comprises a plurality of xMR segments 200a-200n. The number of xMR segments 200a-200n can vary in embodiments. In the embodiment of FIG. 4, adjacent ones of the xMR segments 200a-200n have opposite tilt angles; while xMR segment 200a has a negative tilt angle, xMR segment 200b has a positive tilt angle. The degree of tilt angle also varies, as can be seen between xMR segment 200a when compared with xMR segment 200e. A central xMR segment 200j has a tilt angle of 0 degrees in this embodiment. In addition to have varying tilt angles, xMR segments 200a-200n can have varying lengths; compare again, for example, segment 200a with segment 200e. By varying the length of a particular element, its weight in the averaging function can be defined. The particular configuration of strip 200 is exemplary of only one embodiment, and other configurations having differently varying tilt angles and lengths are contemplated in other embodiments.

Figure 5:
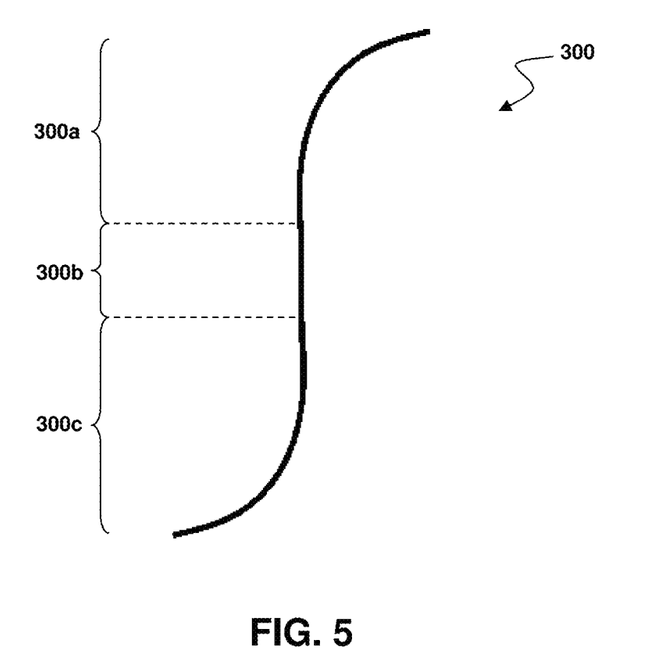
FIG. 5 depicts an xMR strip according to an embodiment.

Another embodiment of an xMR strip 300 is depicted in FIG. 5. XMR strip 300 comprises a continuously increasing and decreasing tilt angle S-shape. The configuration of xMR strip 300 can be thought of as having three segments: a negatively curved segment 300a, a 0-degree segment 300b and a positively curved segment 300c. Because of the similar but opposite orientations of segments 300a and 300c, xMR strip 300 provides equal portions of positively and negatively tilted orientations to provide an effective averaging, as in other embodiments discussed above. As in FIG. 4, the particular configuration of strip 300 is exemplary of only one embodiment, and other configurations having differently curved segments, lengths and/or orientations are contemplated in other embodiments.

Figure 6A:
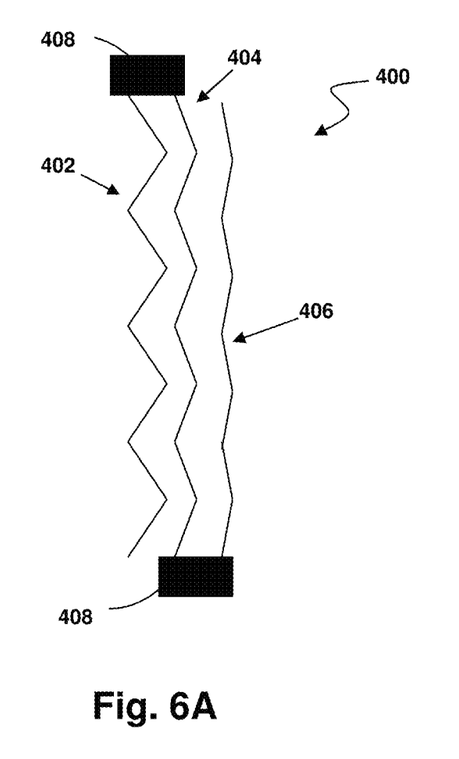
FIG. 6A depicts an xMR strip according to an embodiment.
Figure 6B:
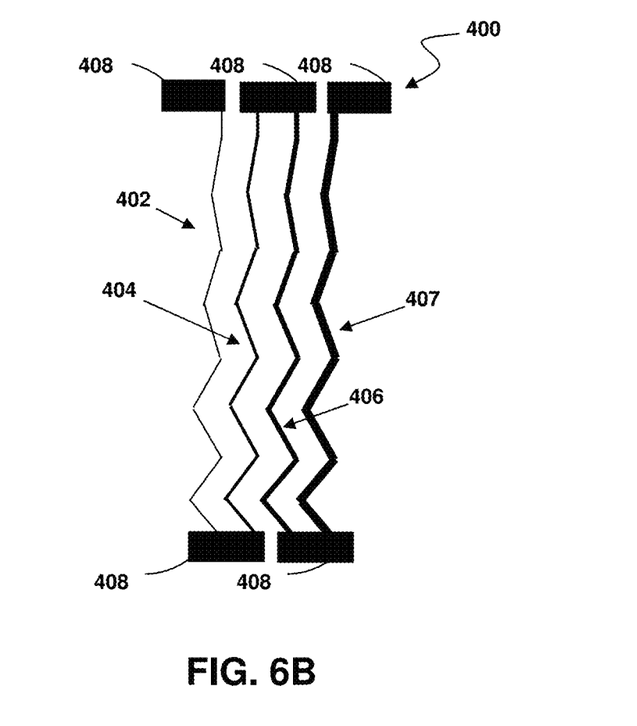
FIG. 6B depicts an xMR strip according to an embodiment.

Other xMR strip embodiments are depicted in FIGS. 6A and 6B. In FIGS. 6A and 6B, XMR strip 400 can have a reduced height as compared with other embodiments by dividing strip 400 into a plurality of serially (FIG. 6A) or parallel (FIG. 6B) coupled adjacent substrips 402, 404 and 406 by suitable metal or other connectors 408. In embodiments, substrips 402, 404 and 406 are arranged substantially parallel to one another, as depicted in FIGS. 6A and 6B. FIG. 6B additionally includes substri 407. Each substrip 402, 404 and 406 comprises a plurality of xMR segments having alternating tilt angles, as in other embodiments. In the embodiments of FIGS. 6A and 6B, the degree of tilt angle generally varies between substrips. For example, the tilt angles of segments of substrip 402 are greater than those of segments of substrip 404, which are in turn greater than those of segments of substrip 406. Such a configuration can still present an effective signal averaging even under inhomogeneous magnetic field conditions. In addition, the width of the substrips can also vary, thereby influencing the angle phase of the switching discontinuity which can lead to an effective geometric averaging (refer, for example to FIG. 6B). As in FIGS. 4 and 5, the particular configuration of strip 400 is exemplary of only one embodiment, and other configurations having differently varying tilt angles, lengths, numbers and configurations of substrips and/or segments and other characteristics are contemplated in other embodiments.

Figure 6C:
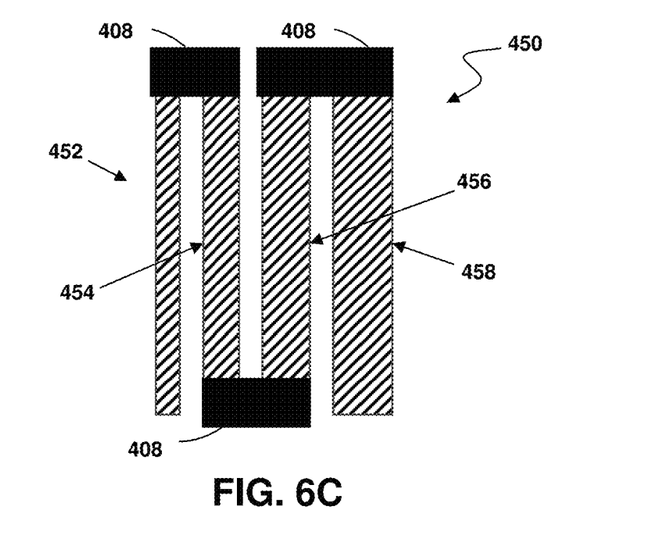
FIG. 6C depicts an xMR strip according to an embodiment.

Another xMR strip 450 is depicted in FIG. 6C. XMR strip 450 comprises serially coupled segments 452, 454, 456 and 458, each having a different width and with the same length axis orientation. Because of the width dependent shape anisotropy, each segment 452-458 exhibits a different phase angle of the switching discontinuity and, therefore, an averaging effect takes place. While the widths increase from segment 452 to 458, other configurations are possible in other embodiments, FIG. 6C being exemplary of but one embodiment.

Figure 6D:
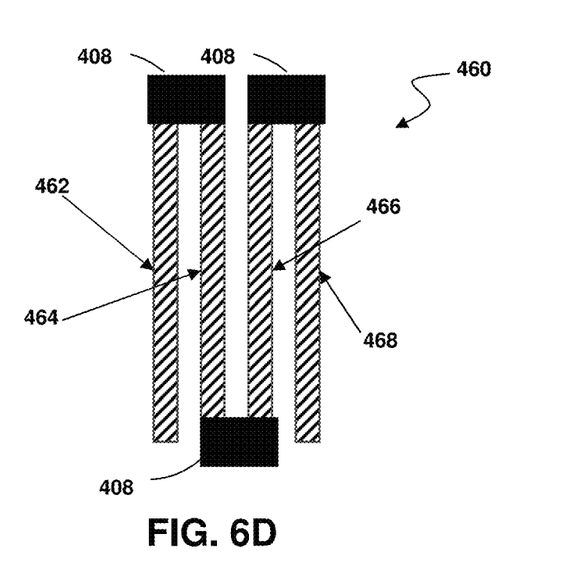
FIG. 6D depicts an xMR strip according to an embodiment.
Figure 6E:
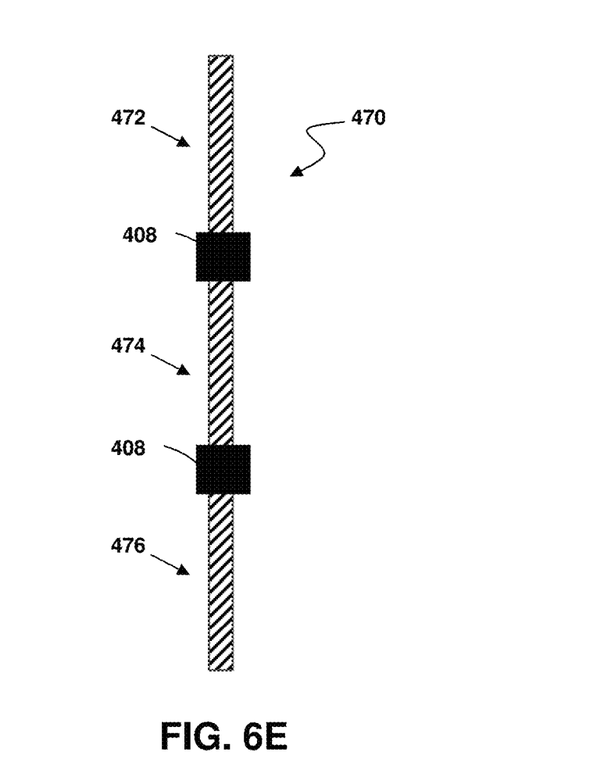
FIG. 6E depicts an xMR strip according to an embodiment.

Another embodiment is depicted in FIG. 6D. In FIG. 6D, xMR strip 460 comprises a plurality of serially coupled strip segments 462, 464, 466 and 468, each having the same nominal width and length axis orientation. Because segments 462-468 do not have identical values for the shape anisotropy, e.g. because of local fluctuations of the xMR structuring process, the phase angle of the switching discontinuity will differ for the individual segments 462-468. As a result, an averaging effect takes place. This also occurs if a long strip is subdivided into substrips which are serially connected by connectors, thereby keeping the full strip length, as is depicted in strip 470 in FIG. 6E. The decoupling of the magnetic properties allows single substrips 472, 474, 476 to react individually according to natural fluctuations of their magnetic properties on the external magnetic field, which leads to an averaging effect.

Figure 7:
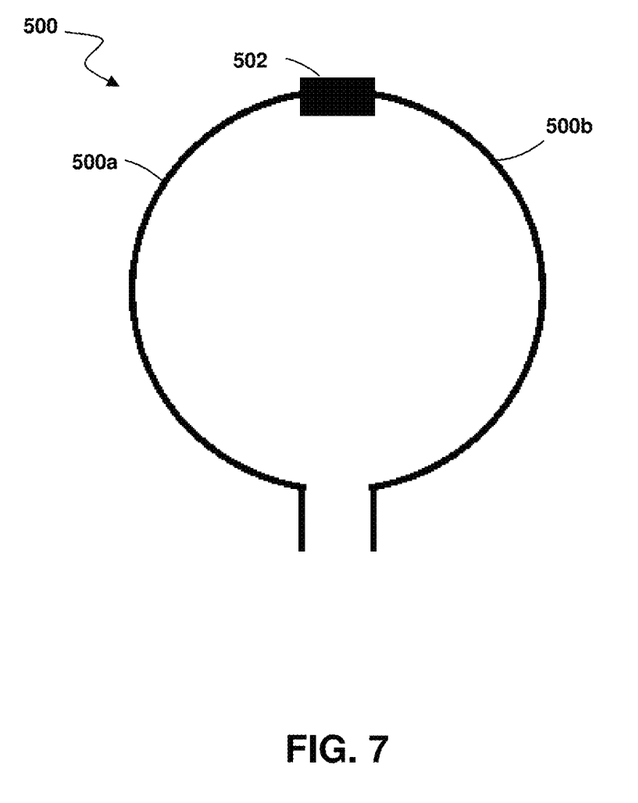
FIG. 7 depicts an xMR strip according to an embodiment.

Another xMR strip 500 is depicted in FIG. 7, somewhat similar conceptually to FIG. 5. XMR strip 500 comprises two segments 500a and 500b serially connected by a suitable metal or other connector 502. As in xMR strip 300, strip 500 presents a continuous distribution of tilt angles, providing a highly effective geometric averaging of the magnetic behavior of segments 500a and 500b.

As previously mentioned, discontinuities can also be addressed in embodiments by an xMR strip comprising a varying width or other characteristic, such as a shape anisotropy. Conventional xMR sensors comprise strips such as those depicted in FIG. 1, isotropic rectangles. Such strips, however, can generate 180 degree domain walls because the free layer magnetization is exposed to rotating fields with opposing senses of rotation due to parasitic By components. Embodiments discussed herein, however, avoid these domain walls and their related discontinuities by preventing the magnetizations from fully rotating by a varying, adapted xMR strip width. A reduced strip width results in an increased shape anisotropy therefore in an enhanced stabilization of the magnetization in regions in which a rotation of the magnetic field takes place. The stronger the By component of a rotating field, the smaller the strip width needs to be. As a consequence, the strip width is continuously reduced toward the strip ends in an embodiment.

Figure 8:
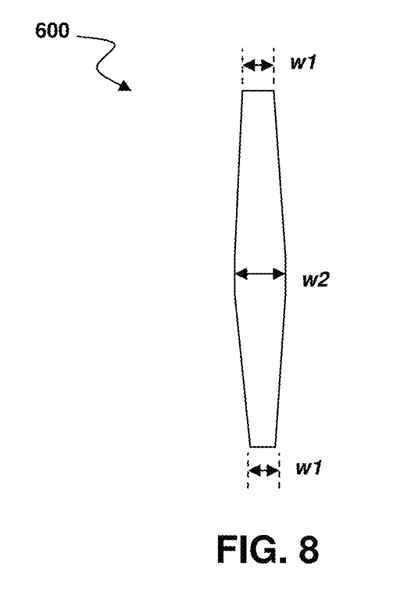
FIG. 8 depicts an xMR strip according to an embodiment.

An embodiment is depicted in FIG. 8. In FIG. 8, xMR strip 600 has a first width w/at each end and a second width w2 in the middle, with the width varying between each end and the middle. In another embodiment, strip 600 has different widths at each end.

Figure 9:
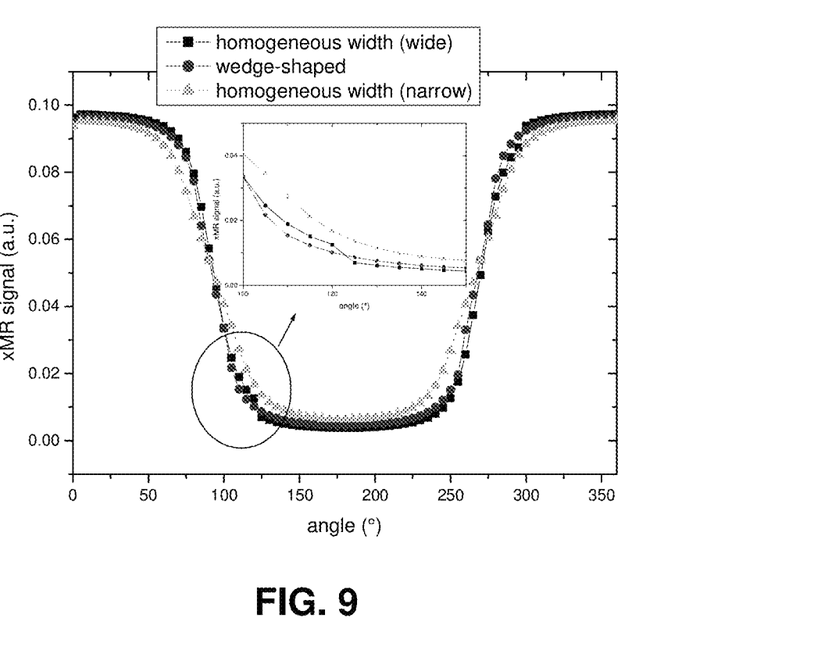
FIG. 9 depicts simulation results for various widths according to an embodiment.

Simulation results for xMR strip 600 are depicted in the graph of FIG. 9, in which w/is 1 micrometer (μm) and w2 is 1.5 μm. Also depicted are simulation results for two conventional strips having widths of 1 μm and 1.5 μm. As can be seen, no discontinuities or sudden jumps in the output signal are observed for the wedge-shaped strip 600 because no 180-degree domain walls are generated. Further, for the conventional strip with a width of 1 μm, no sudden jump in the output signal is seen, but the enhanced shape anisotropy leads to a disadvantageous reduction in sensitivity.

Figure 10:
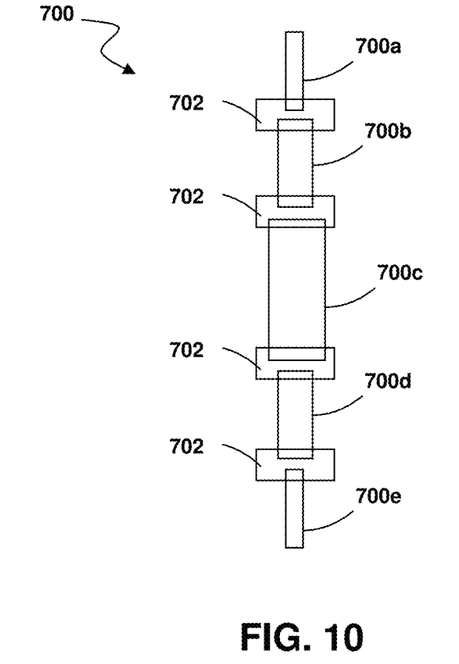
FIG. 10 depicts an xMR strip according to an embodiment.
Figure 11:
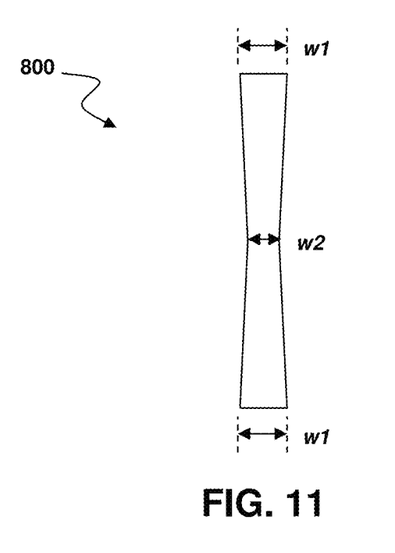
FIG. 11 depicts an xMR strip according to an embodiment.

Additional embodiments are depicted in FIGS. 10 and 11. In FIG. 10, an XMR strip 700 has a similar profile to that of strip 600 of FIG. 8, but strip 700 comprises a plurality of individual strip segments 700a-700e coupled by suitable metal or other connectors 702. While strip 700 comprises five segments 700a-700e, other embodiments can comprise more or fewer segments. Further, each individual segment can be an isotropic rectangle or have a varying width in various embodiments.

In FIG. 11, an xMR strip 800 has an inverse wedge shape in which w1 at each end is greater than w2 in the middle. Strip 800 is similar to but the opposite of strip 600 of FIG. 8. As for strip 600, strip 800 can also have different widths at each end. Strip 800 can be used in embodiments when a backbias magnet with a magnetization perpendicular to the sensor plane is used, comprising a symmetric, bipolar bias field along the strip length (By component). The magnitude of the By component increases from the center to the strip ends. An increase of the strip width towards the ends leads to a gradually reduced shape anisotropy which therefore has a compensating effect on the reduced sensitivity by the By component. As a result, the sensitivity of the entire strip 800 is not unnecessarily decreased.

Embodiments can also comprise hybrid configurations of various strips discussed herein. For example, strip 200 can comprise segments 200a-200n shaped like strip 600. Various other configurations are also possible, as appreciated by those having skill in the art, for example the combination of different widths and angles.

Embodiments discussed herein can therefore address discontinuities associated with conventional xMR sensors. Embodiments thus can improve xMR sensor performance and provide advantages over conventional sensors, including reduced or eliminated discontinuities.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, implantation locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A magnetoresistive sensor element comprising a magnetoresistive strip intersected by a line at a first point, a second point, a third point, and a fourth point on the magnetoresistive strip, the magnetoresistive strip comprising:
   a first linear segment including the first point intersected by the line;
   a second linear segment arranged in series with the first linear segment and including the second point intersected by the line, the second linear segment adjoining the first linear segment at a first inner corner, wherein a first obtuse angle is defined between the first linear segment and the second linear segment at the first inner corner, the first obtuse angle having a first magnitude, the first inner corner spaced apart from the line;
   a third linear segment arranged in series with the second linear segment and including the third point intersected by the line; and
   a fourth linear segment arranged in series with the third linear segment and including the fourth point intersected by the line, the fourth linear segment adjoining the third linear segment at a second inner corner, wherein a second obtuse angle is defined between the third linear segment and the fourth linear segment at the second inner corner, the second obtuse angle having a second magnitude, the second inner corner spaced apart from the line and the second magnitude differing from the first magnitude.

2. The magnetoresistive sensor element of claim 1, wherein the magnetoresistive strip is one of a giant magnetoresistive (GMR) strip, a tunneling magnetoresistive (TMR) strip or an anisotropic magnetoresistive (AMR) strip.

3. The magnetoresistive sensor element of claim 1, wherein the first linear segment, the second linear segment, the third linear segment, and the fourth linear segment are each arranged in series with one another on a continuous path extending from a first non-magnetic metal conductor to a second non-magnetic metal conductor.

4. The magnetoresistive sensor element of claim 3, further comprising:
   a fifth linear segment arranged in series with the fourth linear segment; and
   a sixth linear segment arranged in series with the fifth linear segment, the sixth linear segment adjoining the fifth linear segment at a third inner corner corresponding to a third obtuse angle having a third magnitude, the third magnitude differing from each of the first magnitude and the second magnitude.

5. The magnetoresistive sensor element of claim 4, wherein the first magnitude is greater than the second magnitude, and the second magnitude is greater than the third magnitude.

6. The magnetoresistive sensor element of claim 1, wherein the second linear segment and the third linear segment are arranged between the first linear segment and the fourth linear segment.

7. A magnetoresistive sensor element, comprising:
   a first non-magnetic metal conductor;
   a second non-magnetic metal conductor spaced apart from the first non- magnetic metal conductor, wherein a line intersects the first non-magnetic metal conductor and the second non-magnetic metal conductor;
   a first linear magnetoresistive strip segment between the first non-magnetic metal conductor and the second non-magnetic metal conductor and intersecting the line,
   a second linear magnetoresistive strip segment arranged in series with the first linear magnetoresistive strip segment and intersecting the line, the second linear magnetoresistive strip segment and the first linear magnetoresistive strip segment being orientated with respect to one another to define a first inner corner, wherein a first obtuse angle is defined between the first linear magnetoresistive strip segment and the second linear magnetoresistive strip segment at the first inner corner, the first obtuse angle having a first magnitude;
   a third linear magnetoresistive strip segment arranged in series with the first and second linear magnetoresistive strip segments and intersecting the line, and
   a fourth linear magnetoresistive strip segment arranged in series with the first, second, and third linear magnetoresistive strip segments and intersecting the line, the fourth linear magnetoresistive strip segment and the third linear magnetoresistive strip segment being orientated with respect to one another to define a second inner corner, wherein a second obtuse angle is defined between the third linear magnetoresistive strip segment and the fourth linear magnetoresistive strip segment at the second inner corner, the second obtuse angle having a second magnitude, the second magnitude differing from the first magnitude.

8. The magnetoresistive sensor element of claim 7, wherein the first linear magnetoresistive strip segment is one of a giant magnetoresistive (GMR) strip, a tunneling magnetoresistive (TMR) strip or an anisotropic magnetoresistive (AMR) strip.

9. The magnetoresistive sensor element of claim 7, wherein the magnetoresistive sensor element has a reference magnetization direction, and wherein each of the first linear magnetoresistive strip segment, the second linear magnetoresistive strip segment, the third linear magnetoresistive strip segment, and the fourth linear magnetoresistive strip segment have a different orientation than the reference magnetization direction.

10. A magnetoresistive sensor element of a spin-valve type having a reference magnetization direction, comprising:
   a plurality of linear magnetoresistive strip segments, wherein the plurality of linear magnetoresistive strip segments comprises a first linear magnetoresistive strip segment, a second linear magnetoresistive strip segment, a third linear magnetoresistive strip segment, and a fourth linear magnetoresistive strip segment that are connected in series between a first metal connector and a second metal connector;
   wherein the first linear magnetoresistive strip segment is adjacent to the second linear magnetoresistive strip segment, and the first linear magnetoresistive strip segment and the second linear magnetoresistive strip segment are oriented to define a first obtuse angle at a first inner corner at which the first linear magnetoresistive strip segment contacts the second linear magnetoresistive strip segment, the first obtuse angle having a first magnitude;
   wherein the third linear magnetoresistive strip segment is adjacent to the fourth linear magnetoresistive strip segment, and the third linear magnetoresistive strip segment and the fourth linear magnetoresistive strip segment are oriented to define a second obtuse angle at a second inner corner at which the third linear magnetoresistive strip segment contacts the fourth linear magnetoresistive strip segment, the second obtuse angle having a second magnitude differing from the first magnitude; and wherein each of the first linear magnetoresistive strip segment, the second linear magnetoresistive strip segment, the third linear magnetoresistive strip segment and the fourth linear magnetoresistive strip segment have a different orientation with respect to the reference magnetization direction.

\* \* \* \* \*